United States Patent [19]

Vasile

[11] Patent Number: 4,705,967
[45] Date of Patent: Nov. 10, 1987

[54] MULTIFUNCTION FLOATING FET CIRCUIT
[75] Inventor: Carmine F. Vasile, Huntington, N.Y.
[73] Assignee: Hazeltine Corporation, Greenlawn, N.Y.
[21] Appl. No.: 793,373
[22] Filed: Oct. 31, 1985
[51] Int. Cl.$^4$ .................... H03K 3/353; H03K 17/60; G06G 7/00; H03F 3/04
[52] U.S. Cl. .................................. 307/304; 307/571; 307/529; 330/301; 330/275; 330/277
[58] Field of Search ....................... 330/301, 275, 277; 307/571, 584, 304, 529, 512, 513, 282, 314, 448; 333/25; 332/9 T; 328/160, 21

[56] References Cited

U.S. PATENT DOCUMENTS 3,727,078  4/1973  Wollesen .......................... 330/277
4,518,871  5/1985  Toyoda et al. ..................... 307/448

Primary Examiner—Stanley D. Miller
Assistant Examiner—Trong Quang Phan
Attorney, Agent, or Firm—E. A. Onders; F. R. Agovino

[57] ABSTRACT

A transistor circuit is provided with a symmetrical floating configuration for attaining multifunction operation of a transistor having symmetrical source and drain characteristics, preferably a GaAs MESFET. The circuit includes a balun which may be configured as a transformer, a differential amplifier, or a magic-tee waveguide depending on the frequency of signals to be processed by the circuit. Balanced terminals of the balun may be directly or capacitively coupled to source and drain terminals of the transistor. Tuning circuits are employed for applying signals having different frequencies to the transistor and for extracting intermodulation products generated by the transistor in response to the signals at the different frequencies. With the direct connection between the balun and the transistor, alternating voltages may be impressed between the terminals of the transistor to alternate source and drain regions of the transistor. Functions of amplification, modulation, bipolar attenuation, four-quadrant multiplication and correlation, power frequency tripling, and mixing are obtainable. The transistor may be replaced with a pair of transistors connected in series or in antiparallel connection.

37 Claims, 9 Drawing Figures

4,705,967

MULTIFUNCTION FLOATING FET CIRCUIT

BACKGROUND OF THE INVENTION

This invention relates to transistor circuits having a floating active element and, more particularly, to a floating field-effect transistor (FET) constructed with interchangeable source and drain regions.

Balanced circuit configurations, such as push-pull amplifiers, are well known. Such circuits generally employ paired active elements operating in dual channels and connecting with a balun, such as a transformer or differential amplifier, which combines signals of the two channels to produce a single output signal. The two channels with the paired active elements are employed because, as a general rule, active elements such as transistors operate effectively for current flow in only one direction. The transistors have been constructed to optimize the characteristics of the specific terminals, such as source and drain or emitter and collector for current flow in a preset direction.

The use of paired transistors, such as a type n-p-n and type p-n-p transistors, by way of example, in respective ones of the channels of the balanced circuit tends to compensate for the lack of symmetry in the characteristics of the individual transistors for improved operation of the balanced circuit. Symmetrical characteristics, as used herein, refers to interchangeability of source and drain regions or emitter and collector regions in a transistor upon a change in the polarity of the gate or base voltage.

A problem arises in that the use of paired transistors in dual channel balanced circuits to compensate for the lack of symmetry in the transistor characteristics introduces excessive complexity to the circuitry. In addition, such balanced circuitry does not have as much flexibility for use in a variety of circuit functions as could be accomplished if the transistor characteristics were fully symmetrical.

SUMMARY OF THE INVENTION

It has been found that an FET fabricated of gallium arsenide (GaAs) and formed with a metal-semiconductor junction, usually referred to as a MESFET, can be provided with source and drain regions which are interchangeable. A graph of current passing between the source and the drain regions shows both positive and negative current flow upon a reversal of excitation voltage and, furthermore, shows that the positive and negative portions of the current characteristic are symmetrical. Reversal of polarity of the excitation voltage, applied between the source and the drain regions effectively interchanges the source and the drain regions. Also, the dependency of the current on gate-source voltage is the same for both positive and negative directions of current flow.

Thus, it is an object of the invention to provide a circuit suitable for utilizing the symmetrical characteristics of the GaAs MESFET or other transistor for a balanced circuit operation.

This object is accomplished in accordance with the invention by connecting source and drain terminals of the transistor to the pair of balanced terminals of a balun, the balun combining the output signals of the source and the drain terminals to a single signal at the unbalanced terminal of the balun. In a preferred embodiment of the invention, the balun has the form of a transformer to permit two-way transmission of signals, either from the transistor to the unbalanced terminal, or from the unbalanced terminal to the transistor. The transistor and the balun form a part of a transistor circuit wherein all three terminals of the transistor, namely. the source, the gate, and the drain terminals, are floating with respect to ground and with respect to terminals of a power supply which energizes the circuit. The term "floating" as used herein means that no terminal of the transistor is connected directly to ground or to a terminal of a power supply but, rather, is connected directly. In the preferred embodiment of the invention, such indirect connection is accomplished by way of inductors serially connected between the transistor terminals, and the power supply terminals and ground.

The foregoing circuit of the invention has a balanced configuration and can be energized symmetrically such that either polarity of voltage may be applied between the source and the drain terminals. A DC (direct current) bias voltage may be applied between the gate and the source terminals. The connections between the transistor and the balun may be direct or via capacitive coupling in accordance with the desired functions to be provided by the circuit.

The circuitry of the invention is advantageous in being operable over a wide frequency range. The GaAs MESFET is operable over frequencies ranging from zero to the microwave range. The magnitudes of inductance and capacitance employed in the circuit is adjusted for the frequency range of signals employed with the circuit. For DC and near DC operation, the balun comprises an operational amplifier instead of a transformer, the latter being utilized for higher frequencies up to the near-microwave region. At the microwave region, the balun is fabricated as a magic-tee waveguide assembly wherein the balanced arms are coupled to the source and the drain terminals, while the unbalanced arm of the assembly serves as the unbalanced terminal of the balun.

BRIEF DESCRIPTION OF THE DRAWING

The aforementioned aspects and other features of the invention are explained in the following description, taken in connection with the accompanying drawing wherein.

DETAILED DESCRIPTION

Figure 1:
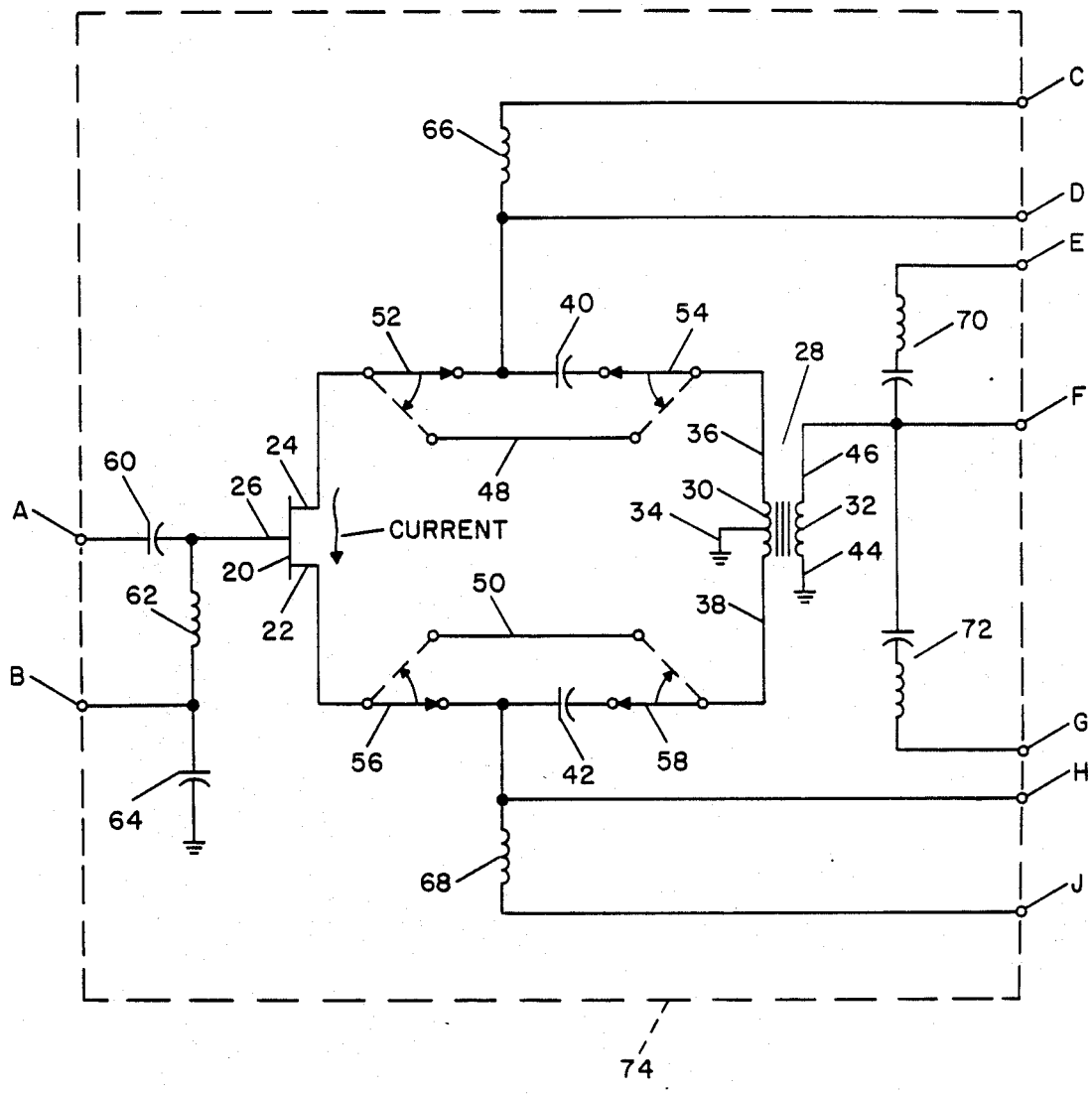
FIG. 1 shows a basic circuit of the invention incorporating a transistor having symmetrical characteristics, and being suitable for accomplishing a variety of functions in accordance with the invention.

With reference to FIG. 1, there is shown an electrical circuit constructed in accordance with the invention to obtain beneficial results from a transistor having symmetrical voltage-current characteristics. The circuit provides a floating connection for such a transistor, preferably a GaAs MESFET, so as to operate with the transistor throughout the range of symmetry including both positive and negative current flow. The circuit includes a set of terminals enabling the connection of both AC (alternating current) signals and bias signals to the transsitor to accomplish a variety of functions such as amplification, modulation, bipolar attenuation, four-quadrant multiplication and correlation, frequency tripling, and mixing. Each of these functions is accomplished by connecting appropriate signals, as will be described hereinbelow to specific ones of the terminals of the circuit. In the following description of the circuit, beginning with FIG. 1, reference will be made to a single transistor 20 which is understood to be a GaAs MESFET, it being understood further that another form of transistor device having symmetry of current-voltage characteristics may also be employed in the circuit. For example, as will be described subsequently two FET's may be coupled in series or in antiparallel arrangement as a transistor device in lieu of the single transistor 20 for improved symmetry of the current-voltage characteristic.

As shown in FIG. 1, the transistor 20 comprises a source terminal 22, a drain terminal 24, and a gate terminal 26. The circuit of FIG. 1 further comprises a balun 28 which is constructed, preferably, as a transformer having two windings 30 and 32. Alternatively, balun 28 may be an operational amplifier, a differential amplifier or a magic-tee waveguide assembly. The winding 30 has a center tap 34, and terminals 36 and 38 which define a winding configuration balanced relative to the center tap 34. The winding terminals 36 and 38 are connected respectively by capacitors 40 and 42 to the source terminal 22 and the drain terminal 24. The center gap 34 is grounded. The winding 32 has a terminal 44 which is grounded, and a terminal 46 by which signals may be coupled into and out of the balun 28.

The coupling provided by the capacitors 40 and 42 is employed for implementing some of the foregoing functions, while a direct connection between the transistor and the balun 28 is employed for implementing other ones of the foregoing functions. The circuit configuration is altered between capacitive and direct coupling by means of a bypass 48 of the capacitor 40 and a bypass 50 of the capacitor 42. The bypass 48 is connected by switches 52 and 54 to the transistor 20 and the balun 28, the switch 52 selectively coupling the drain terminal 24 of the transistor 20 to the capacitor 40 and the bypass 48 while the switch 54 selectively couples the winding terminal 36 to the capacitor 40 and the bypass 48. In similar fashion, the bypass 50 is conencted by switches 56 and 58 to the transistor 20 and the balun 28, the switch 56 selectively coupling the source terminal 22 to the capacitor 42 and the bypass 50 while the switch 58 selectively couples the winding terminal 38 to the capacitor 42 and the bypass 50. The four switches 52, 54, 56, and 58 are operated in unison to provide either the capacitive coupling via capacitors 40 and 42 or the direct coupling by the bypasses 48 and 50 between the transistor 20 and the balun 28.

The circuit of FIG. 1 is provided with a set of terminals identified by the legends A, B, C, D, E, F, G, H, and J by which terminals signals are coupled between the circuit and points external to the circuit. The gate terminal 26 is connected by a capacitor 60 to terminal A, and by an inductor 62 to terminal B. A capacitor 64 connects terminal B with ground, the capacitor 64 and the inductor 62 being serially connected between the gate terminal 26 and ground. Also included within the circuit are two inductors 66 and 68, the inductor 66 coupling terminal C via switch 52 to the drain terminal 24, and the inductor 68 coupling terminal J via switch 56 to the source terminal 22. The inductors 66 and 68 may be bypassed, if desired, by means of the terminals D and H which can be directly coupled via the switches 52 and 56, respectively, to the drain terminal 24 and the source terminal 22.

Terminal 46 of the winding 32 is connected directly to terminal F, and is further connected via a tuned circuit 70 to terminal E and a tuned circuit 72 to terminal G. Each of the circuits 70 and 72 include a capacitor and an inductor having values of capacitance and inductance which are tuned to specific frequencies as will be described subsequently. The set of terminals E, F, and G can be used for coupling signals from external points into and out of the balun 28 as will be described hereinbelow. Terminals C and J are employed for outputting signals as well as for receiving input power. Terminals D and H are employed for outputting signals. The terminals A and B receive input signals, the utilization of the respective terminals depending on the specific functions to be provided by the circuit of FIG. 1 as will be described in subsequent ones of the figures. Thus, the circuit of FIG. 1 may be regarded as a system 74 by which the symmetrical characteristics of the transistor 22 may be employed for implementing a variety of functions.

Figure 2:
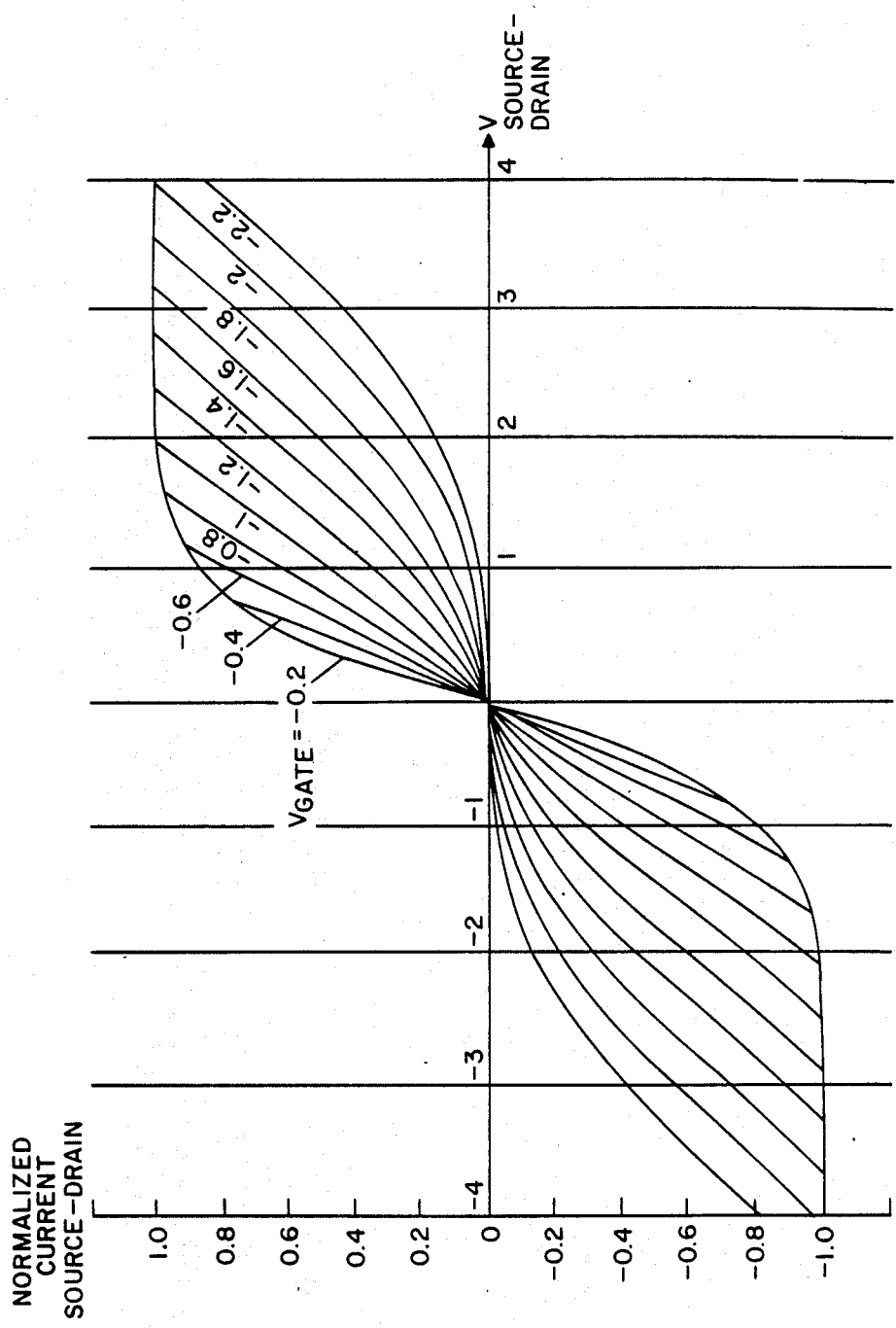
FIG. 2 is a graph showing the symmetrical current-voltage characteristics of the transistor of FIG. 1.

In a preferred embodiment of the invention, the transistor 20 is a GaAs MESFET. FIG. 2 shows the symmetric current-voltage characteristics of the GaAs MESFET. Current is plotted along the vertical axis of the graph, the values of current being normalized relative to the maximum current shown on the graph. The current flows between the source and the drain electrodes of the transistor 20, with the positive sense of current flow being from the drain electrode to the source electrode 22. The voltage between the source and the drain electrodes is plotted on the horizontal axis of the graph, the potential of the drain terminal 24 being positive relative to the potential of the source electrode 22 for positive flow of current. The graph shows symmetry relative to ground. Also shown in the graph is the effect of negative bias voltage applied to the gate terminal 26 relative to the source terminal 22. The polarity of the bias voltage is reversed for reversed polarity of the source-drain voltage.

In the operation of the system 74 of FIG. 1 with an RF signal, a bias voltage can be applied to the gate terminal 26 via terminal B and the inductor 62. Any RF signal at the gate terminal 26 is shunted away from a source of bias at terminal B by the inductor 62 and the capacitor 64. The inductor 62 tends to block RF signals from a bias source connected to terminal B while the capacitor 64 provides a path for RF signals to ground to bypass a bias source connected to terminal B. Similarly, the inductors 66 and 68 can conduct current from a source of power, connected between terminal C and J, through 20 while inhibiting the passage of RF signals to the power sources. Further details in the operation of the system 74 for providing the various functions are described now with reference to FIGS. 3-7.

Figure 3:
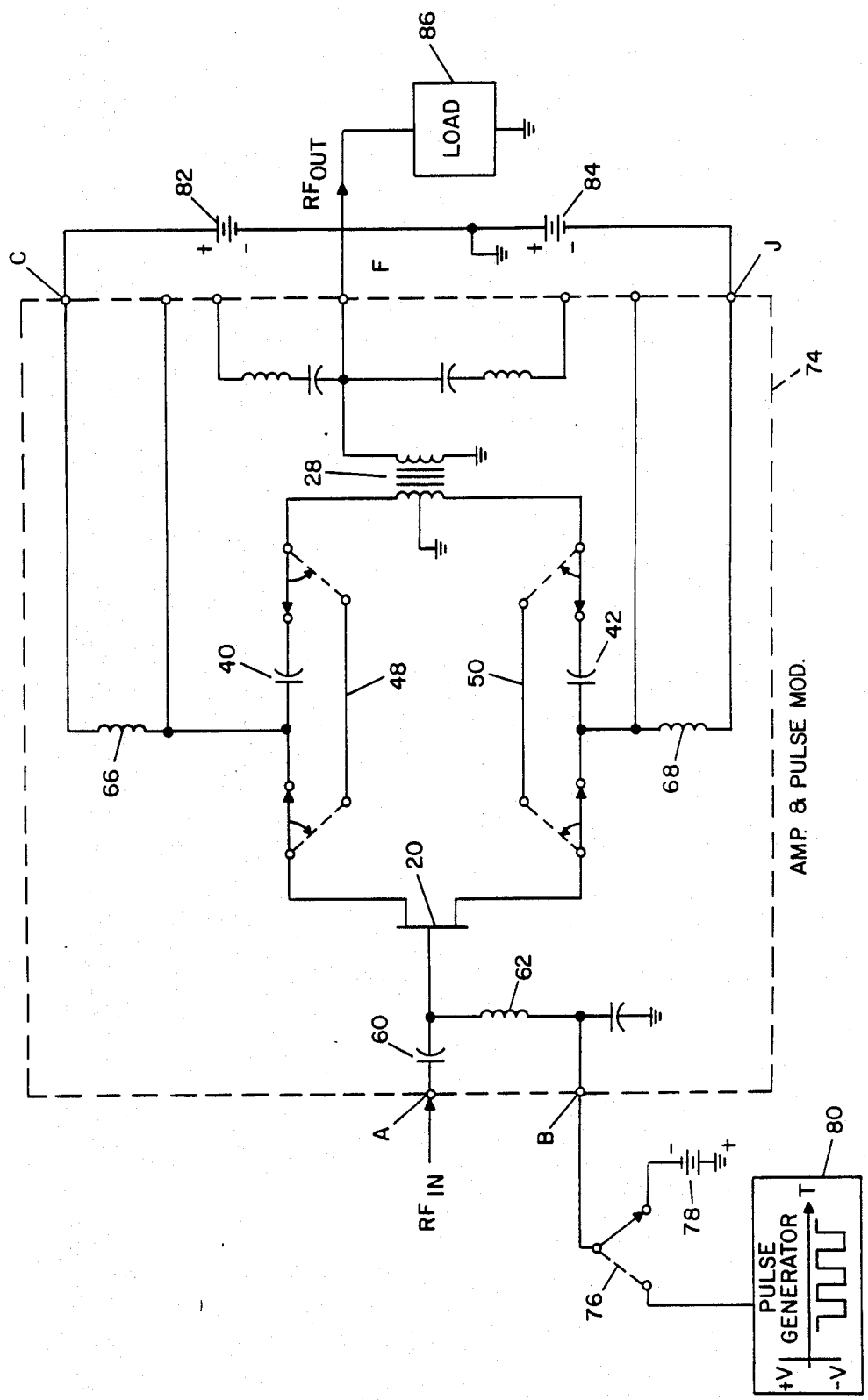
FIG. 3 shows excitation of the circuit of FIG. 1 to accomplish the functions of amplification and pulse modulation.

FIG. 3 shows the use of the system 74 for providing functions of amplification and pulse modulation. An RF signal is applied to terminal A to be processed by the system 74, and then is outputted from terminal F. Terminal B is coupled via a switch 76 to a fixed source of negative bias represented by a battery 78 for operation of the system 74 as an amplifier. Pulse modulation of the RF signal is obtained by replacing the fixed bias voltage of the battery 78 with a pulsed bias voltage as is provided conveniently by a pulse generator 80 connected to the switch 73. In the alternate position of the switch 73, the switch 73 couples pulses from the generator 80 to terminal B and disconnects the battery 78 from terminal B. Power for operation of the transistor 20 is provided by a source of electrical power represented by batteries 82 and 84 coupled between ground and respectively the terminals C and J. Current from the batteries 82 and 84 passes via the inductors 66 and 68 to the transistor 20. The batteries 82 and 84 are poled to provide a voltage at the drain terminal which is positive with respect to ground, and a voltage at the source terminal which is negative with respect to ground.

In operation, the system 74 of FIG. 3 provides amplification of an input signal at terminal A with the switch 76 connecting a fixed bias voltage from the battery 78 to terminal B. The input signal, which by way of example, may be an RF signal, is coupled via the capacitor 60 to the gate terminal of the transistor 20. The bias voltage at terminal B is coupled via the inductor 62 to the gate terminal of the transistor 20. By way of example, each of the batteries 82 and 84 may apply a voltage of approximately 1.0 volts for a total of 2 volts across the source and the drain terminals of the transistor 20. The bias voltage provided by the battery 78 may be approximately 1.5 volts with a polarity negative relative to ground. These values of voltage place the operating point of the transistor 20 in the upper right quadrant of the graph of FIG. 2. The peak-to-peak voltage of the input signal is substantially less than the bias voltage of the battery 78 to insure linear operation of the system 74. Output RF current from the resistor is applied via the capacitors 40 and 42 to the balun 28 which, in turn, couples the output current to terminal F. By way of example, the transformer of the balun 28 may have a turns ratio of 1:1 though, it is to be understood that other turns ratios may be employed as may be desireable for matching impedance and for driving a load 86 coupled between terminal F and ground. It is noted that the bypasses 48 and 50 of FIG. 1 are not employed in the circuit of FIG. 3, the bypasses being disconnected by the switches 52, 54, 56, and 58. The foregoing operation of the circuit of FIG. 3 shows how the system 74 is employed for linear amplification of an input signal having a magnitude substantially smaller than the voltages provided by the batteries 78, 82, and 84.

The foregoing operation can be modified by operation of the switch 76 to connect the generator 80 in place of the battery 78 for applying pulses for bias voltage via the inductor 62 to the gate terminal of the transistor 20. The duration of each pulse provided by the generator 80 is understood to be much longer than the period of the RF input signal at terminal A for gating the RF signal in this example of a typical operation of the system 74. During the presence of each pulse of bias voltage from the generator 80, the transistor 20 conducts current in the same fashion as described above during use of the battery 78. During the interval of time between successive pulses of the generator 80, the transistor 20 is in a state of nonconduction as may be understood from inspection of the graph of FIG. 2. During a state of nonconduction of the transistor 20, no RF signal is coupled via the transistor to be outputted at terminal F. Alternatively, if desired, the voltage provided by the pulses of the generator 80 may vary between a nominal value of bias voltage to a reduced value of bias voltage, in which case conductivity of the transistor 20 is retained but the gain of the transistor 20 is reduced during the intervals between successive ones of the pulses of the generator 80. This results in an output RF signal having an amplitude which varies, an envelope of the amplitude having a square waveform. In either of the foregoing cases employing the generator 80, the system 74 has provided a pulsed amplitude modulation to the RF signal.

Figure 4:
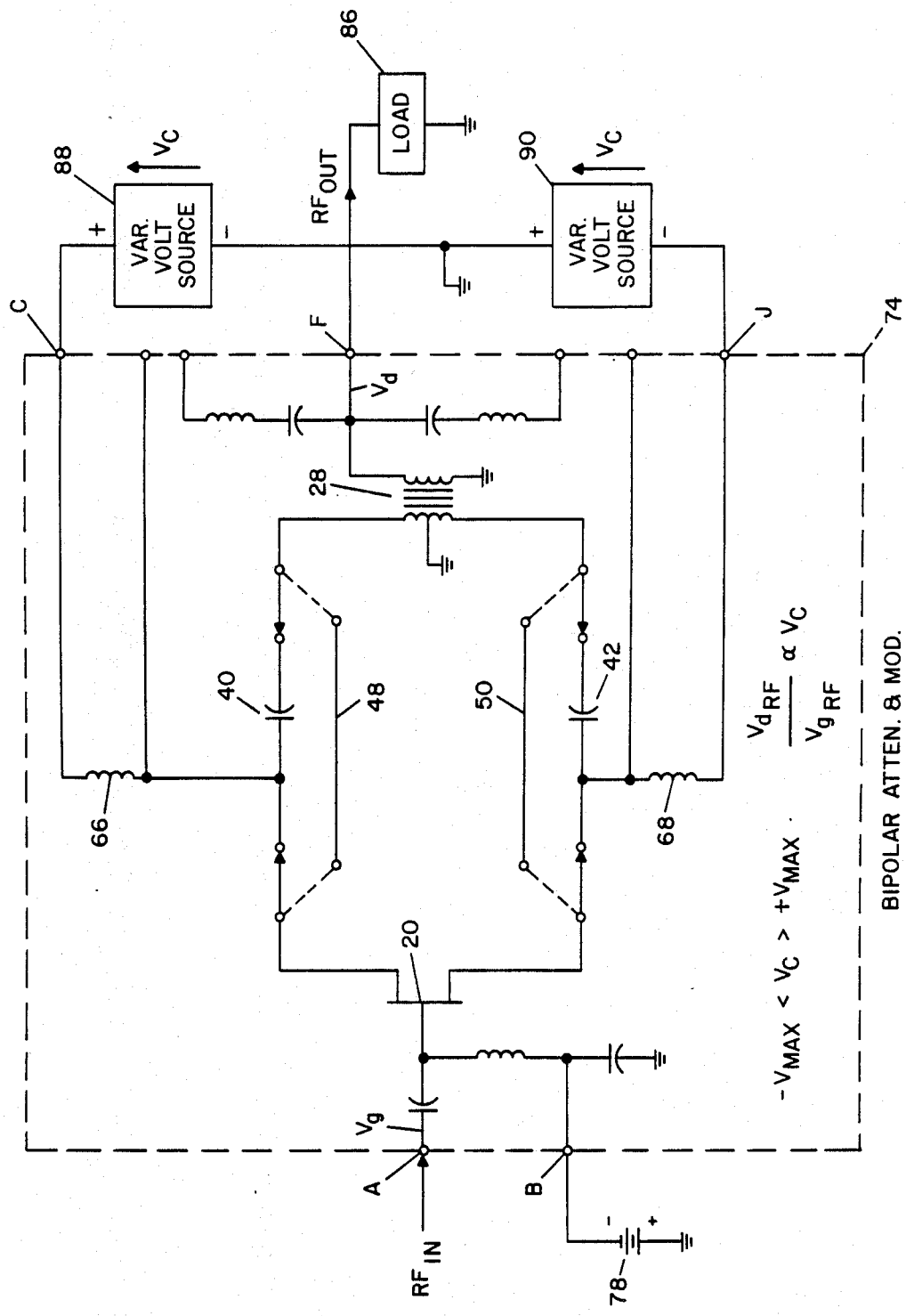
FIG. 4 shows an excitation of the circuit of FIG. 1 to accomplish bipolar attenuation and modulation.

FIG. 4 shows connections of the system 74 to external circuit elements for operation as a bipolar attenuator and modulator. Connections for the system 74 in FIG. 4 are similar to that disclosed above with reference to FIG. 3. In FIG. 4, the bypasses 48 and 50 are disconnected and coupling between the transistor and the balun 28 is accomplished by the capacitors 40 and 42. An RF signal is inputted at terminal A and the battery 78 provides a bias voltage at terminal B. The load 86 is connected to the output terminal F. Instead of the batteries 82 and 84 of FIG. 3, the circuit of FIG. 4 employs variable voltage sources 88 and 90. By way of example, the voltage applied by the series connection of the sources 88 and 90 across the source and drain terminals of the transistor 20 may vary in the range of 0.5-3.0 volts.

As shown in the upper right quadrant of the graph of FIG. 2, such a variation in voltage results in a variation of current of the transistor 20. By way of example, the voltage Vc of the sources 88 and 90 are assumed to be equal and may be varied manually between a maximum and minimum value. As shown in a formula within the block of the system 74, the ratio of output voltage Vd to input voltage Vg is proportional to the value of Vc. In this way, the output RF voltage from the balun 28 can be attenuated relative to the input RF voltage in accordance with a setting of the voltages of the sources 88 and 90. In view of the symmetry of the graph of FIG. 2, if the voltage applied to the gate terminal of the transistor 20 were to become positive, namely, the sum of RF voltage plus the bias voltage of the battery 78, then the voltage Vc would be made negative to provide for the same measure of attenuation. In this way, the system 74 functions as a bipolar attenuator.

The circuit of FIG. 4 can also be operated to provide a modulation function, this being accomplished by varying the voltage Vc of the sources 88 and 90. By way of example, if the sources 88 and 90 comprise signal generators providing a varying output voltage, then the RF signal outputted by the balun 28 has a pattern of amplitude modulation which follows the waveform of Vc.

Figure 5:
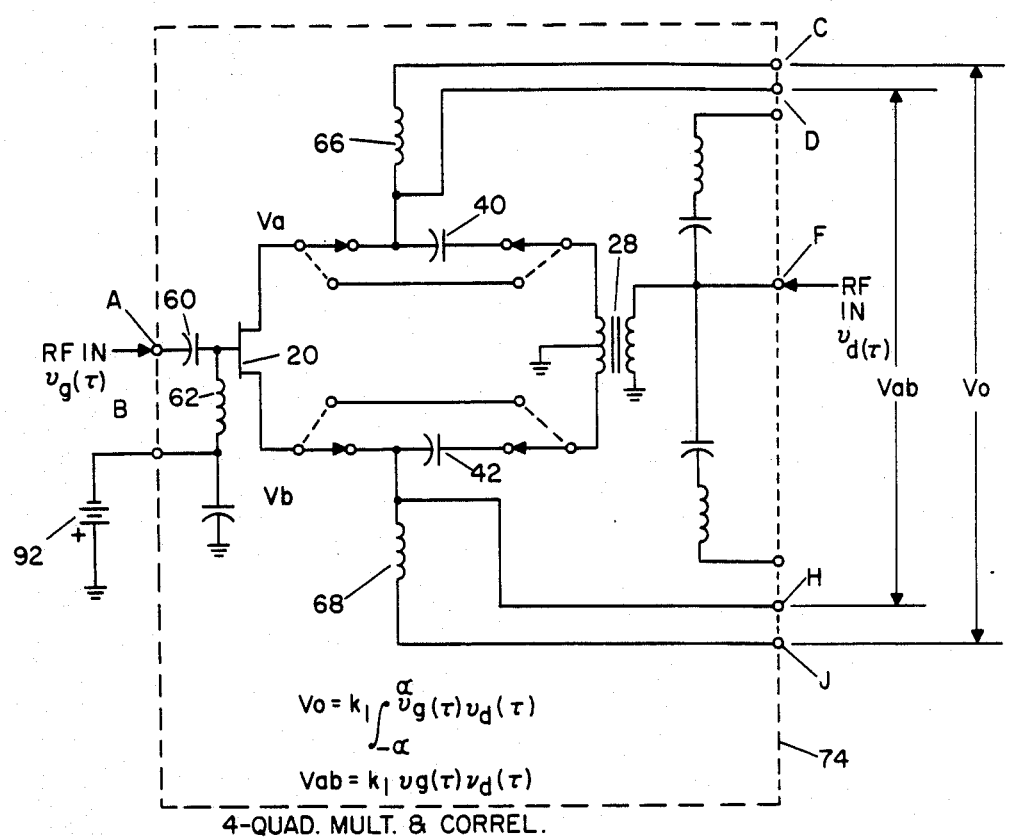
FIG. 5 shows excitation of the circuit of FIG. 1 to accomplish the functions of four- quadrant multiplication and correlation.

FIG. 5 demonstrates operation of the system 74 to provide for the functions of four-quadrant multiplication and correlation. The circuitry of FIG. 5 differs from that of FIGS. 3 and 4 in that terminals C and J are employed for outputting a signal instead of inputting power from a voltage source. Also, the terminals D and H are employed for outputting a signal. The capacitors 40 and 42 couple signals between the transistor 20 and the balun 28. A battery 92 applying a relatively low bias voltage of a few tenths of a volt is coupled to terminal B. Two input AC signals are applied to the system 74, one input signal being applied to terminal A and the other input signal being applied at terminal F. Two algebraic expressions shown within the block of the system 74 show multiplication of the two input signals to provide a product across the terminals D and H. The product is integrated via the inductors 66 and 68 to present a correlation function between the terminals C and J. With respect to the integration, the inductors 66 and 68 integrate incremental variations in the current of the transistor 29 to provide output voltages between the terminals C and J proportional to the product of the two input signals.

In the operation of the circuit of FIG. 5, the input current at terminal F is split by the balun 28 to be applied in balanced fashion via the capacitors 40 and 42 to the transistor 20. The bias voltage provided to the gate terminal of the transistor 20 by the battery 92 is sufficient to bias the transistor away from a pinch off in the active region between source and drain regions of the transistor 20. The two input signals are understood to be small signals with respect to the graph of FIG. 2, the amplitudes of the input signals preferably being smaller than one volt. The multiplication action of the circuit of FIG. 5 may be understood by describing incremental changes in the transistor current as a function of the signal voltage coupled via the capacitor 60 to the transistor 20 and the signal voltage applied by the pair of capacitors 40 and 42 of the transistor 20. The relationship can be expressed mathematically in terms of a Taylor series expansion about the quiescent operating point of the transistor 20. This leads to the products disclosed mathematically on FIG. 5, which multiplication and correlation functions have been observed experimentally for signal voltages in the range of 125–400 millivolts applied to the gate terminal of the transistor 20.

In particular, it is noted that the mathematical expressions apply to both positive and negative excursions of incremental input voltage signals for both of the input signals. Therefore, the multiplication and the correlation is accomplished through four quadrants.

Figure 6:
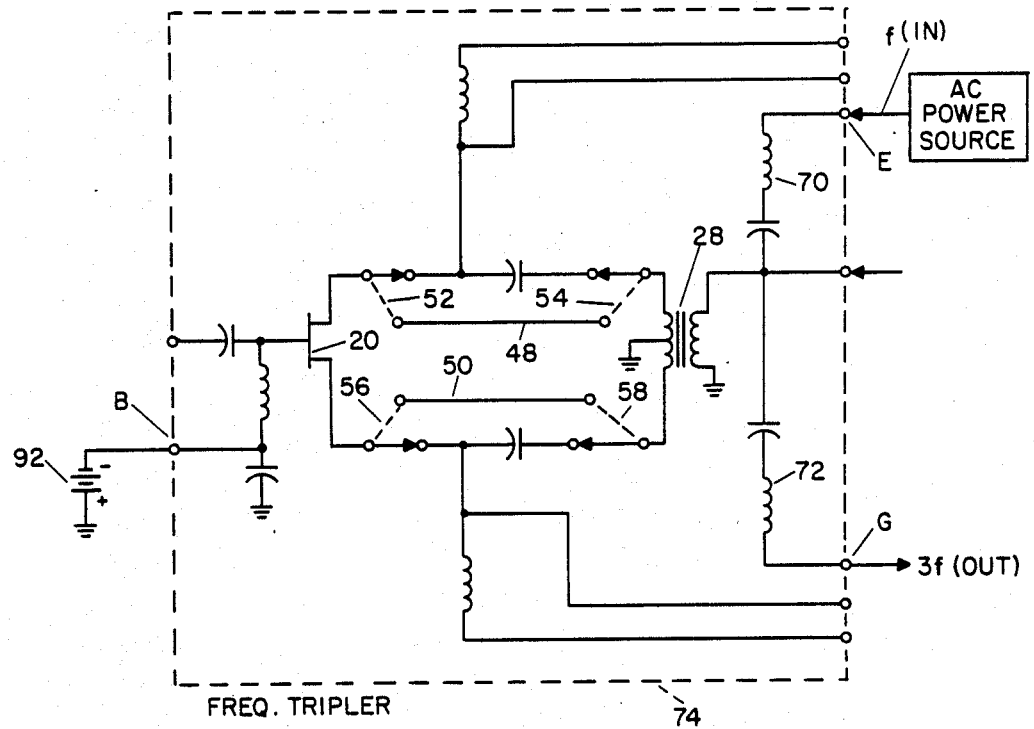
FIG. 6 shows an excitation of the circuit of FIG. 1 to accomplish a function of providing electrical power at a frequency 3 times that of an input frequency.

FIG. 6 shows operation of the system 74 for use as a frequency tripler wherein the system 74 is capable of operating at sufficiently high power levels to provide sufficient power for operating microwave devices at microwave frequencies. Unlike the preceeding circuits of FIGS. 3–5, the circuit of FIG. 6 employs only three terminals, namely terminals B, E, and G. A relatively small bias voltage, as employed in FIG. 5, is also employed in FIG. 6, the bias voltage being applied by the battery 92 to the gate terminal of the transistor 20. In FIG. 6, the switches 52, 54, 56, and 58 have been placed in their alternate positions for connection of the bypasses 48 and 50 between the transistor 20 and the balun 28. The capacitors 40 and 42 of FIG. 1 are not employed in the circuit of FIG. 6. The bypasses 48 and 50 provide a direct connection between the source and the drain terminals of the transistor 20 and the balun 28. By way of example in the operation of the circuit of FIG. 6, an input frequency of 2 GHz (gigahertz) is applied at terminal E, and an output signal of 6 GHz is provided by the system 74 at terminal G. The circuit 70 is tuned to the foregoing frequency of 2 GHz, and the circuit 72 is tuned to the foregoing frequency of 6 GHz.

Assuming that the bias voltage of the battery 92 has been set such that the gate voltage to the transistor 20 is set close to or beyond pinch off, and the voltage applied at terminal E is sufficient to drive the source terminal of the transistor 20 with voltages larger than the voltage of the battery 92, then the voltage developed between the gate and source terminals of the transistor 20 varies between both positive and negative values. Similarly, the voltage appearing between the source and drain terminals of the transistor 20 varies between negative and positive values. Such operation includes two quadrants of the graph of FIG. 2, namely the upper right quadrant and the lower left quadrant. The resulting current in the transistor 20 can be expressed mathematically in terms of a Taylor series expansion which shows substantial power at the third harmonic of the input signal at terminal E.

The third harmonic is captured by the tuned circuit 72 and outputted at terminal G. It is anticipated that conversion efficiencies as high as 40–50% may be attained. The power advantage provided by the circuit of FIG. 6 arises because of the floating configuration of the circuit wherein the transistor 20 is driven with relatively large peak currents and voltage levels (including saturation of the transistor) in both positive and negative directions. By large peak current and voltage levels is meant the extreme values shown in the graph of FIG. 2. Such driving of the transistor is understood to be very much different from the driving of a common source Class-A amplifier often used heretofore in transistor power circuits. Such operation of the transistor 20 takes advantage of the symmetrical properties of the GaAs MESFET construction. The floating configuration of the transistor 20 within the circuit of FIG. 6, and the driving of the transistor 20 with both positive and negative directions of current flow by the balun 28 enables the attainment of the foregoing advantageous power conversion feature of the system 74. An example of a suitable transistor is the GaAs MESFET manufactured by Raytheon under part number RLC 832.

Figure 7:
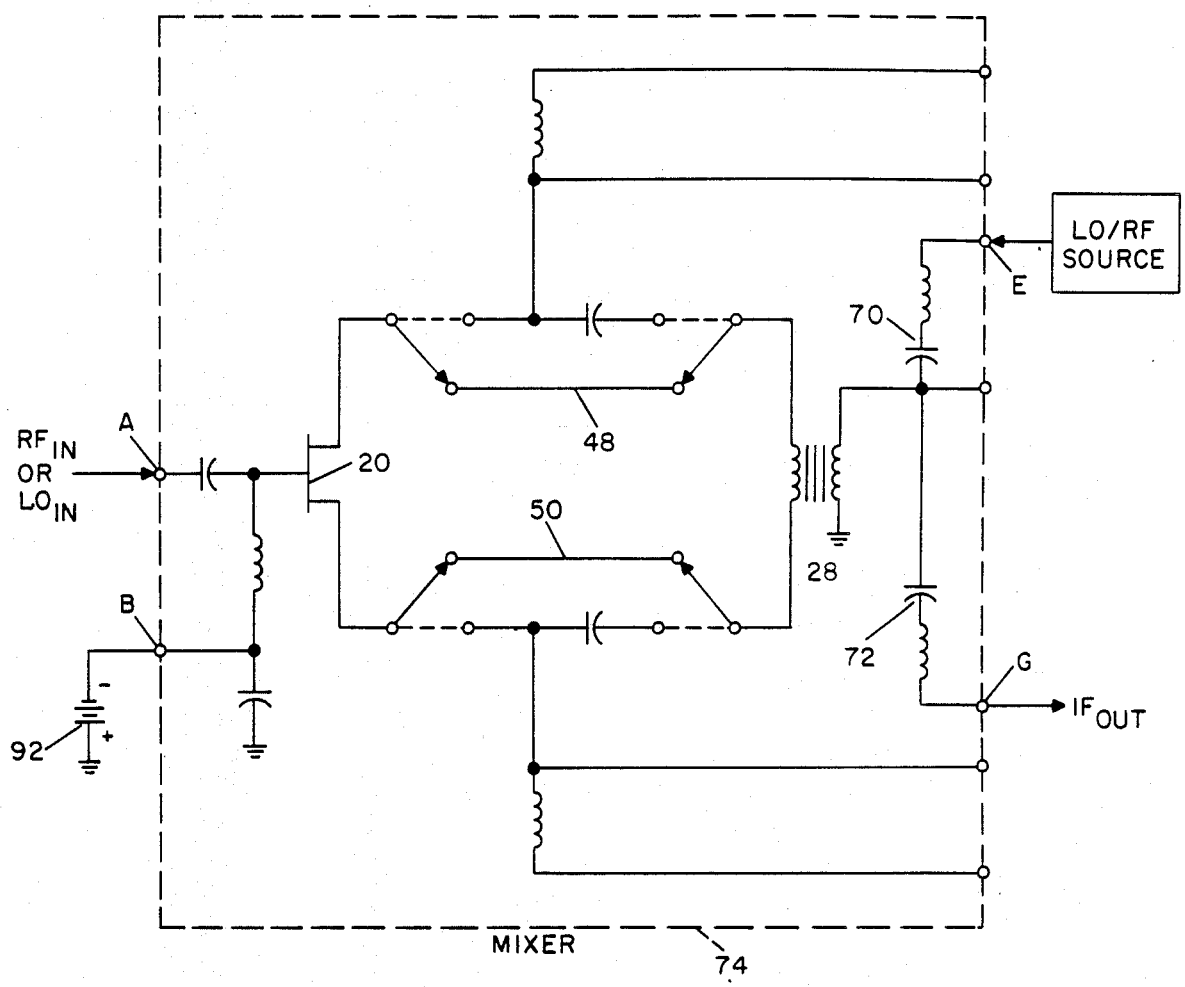
FIG. 7 shows excitation of the circuit of FIG. 1 to accomplish a mixing function.

FIG. 7 shows a modification of the circuitry of FIG. 6 wherein an additional input signal is applied to terminal A. The operation the of circuit of FIG. 7 is similar to that described above with reference to FIG. 6 except that either the signal at terminal A or the signal at terminal E may be employed to drive the transistor 20 to provide for the operation of the system 74 as a mixer. The larger of the two input signals at terminals A and E is regarded as the local oscillator (LO) while the smaller input signal is regarded as the RF input signal. A signal having a frequency equal to the difference of the frequencies of the signals at terminals A and E is outputted at terminal F, the output signal being an IF (intermediate frequency) signal. The transistor 20 is directly coupled by the bypasses 48 and 50 to the balun 28 as in the circuit of FIG. 6. The circuit 70 is tuned to th frequency of the signal inputted at terminal E, and the circuit 72 is tuned to the frequency of the signal outputted at terminal F.

In the operation of the circuit of FIG. 7, the transistor 20 is operated in both of the symmetrical portions of the graph of FIG. 2. As has been described above, operation with two signals introduces a product of the two signals, which product contains a component signal at the intermediate frequency. The IF component is extracted by the tuned circuit 72 to be outputted at terminal G. As long as the transisotr 20 is operated below a saturation level, either type of mixing operation (LO at terminal A or at terminal E) provides a linear relationship between the amplitudes of the RF input and IF output signals over a relatively wide dynamic range with respect to variations of both the LO and RF drive levels. It is also noted that the mixing operation may be employed to provide both down conversion and up conversion so as to provide an output signal at terminal G which may be lower or higher than the RF output signal.

Figure 8:
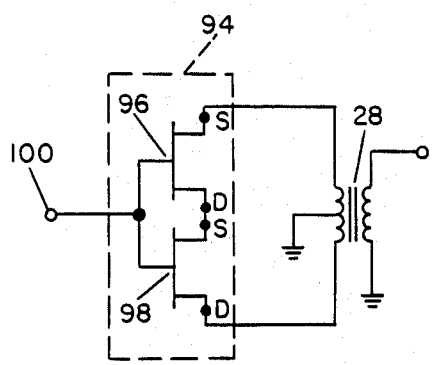
FIG. 8 shows a pair of serially connected transistors in place of the single transistor of FIG. 1.

FIG. 8 shows a transistor device 94 which may be substituted for the transistor 20 of FIG. 1. In FIG. 8, the circuitry of the device 94 is shown in simplified form, the device 94 comprising two field effect transistors 96 and 98 which are connected in series, the source terminal of the transistor 96 being connected to the drain terminal of the transistor 98. Gate terminals of the two transistors 96 and 98 receive input signals from a common terminal 100. The drain terminal of the transistor 96 and the source terminal of the transistor 98 are connected to the balun 28 in the same manner as has been described above for the connection of the drain and source terminals of the transistor 20 to the balun 28.

Figure 9:
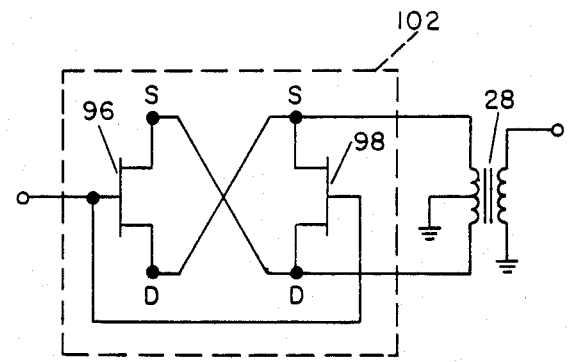
FIG. 9 shows an antiparallel connection of two transistors in place of the single transistor of FIG. 1

In FIG. 9 a transistor device 102 is connected, instead of the transistor 20, to the balun 28. FIG. 9 shows the circuitry of the device 102 in simplified form, the device 102 comprising the transistors 96 and 98 connected together in antiparallel connection.

Both FIGS. 8 and 9 represent alternative embodiments to the circuitry of FIG. 1 wherein the devices 94 and 102 may be employed in lieu of the single transistor 20 of FIG. 1. In FIG. 8, the series connection of the two transistors 96 and 98 tends to compensate for any lack of symmetry in their respective current-voltage characteristics. Thereby, the device 94 can be employed in the system 74 in lieu of the transistor 20, the foregoing description of the operation of the transistor 20 applying also to the device 94. In FIG. 9, any lack of symmetry is compensated by connecting the source terminal of the transistor 96 to the drain terminal of the transistor 98, and the drain terminal of the transistor 96 to the source terminal of the transistor 98. It is noted that the source and drain regions of a field-effect transistor have similar construction so that, by use of the foregoing antiparallel connection, improved symmetry can be provided to the current-voltage characteristics of the device 102. In both FIGS. 8 and 9, it is to be understood that suitable biasing circuits (not shown) are to be included for establishing the operating points of the transistors 96 and 98.

The foregoing description of the various modes of operation of the system 74 demonstrates how the floating congfiguration of the GaAs MESFET in combination with the symmetrical electrical properties of the GaAs MESFET enable the circuitry of the system 74 to have multifunction capability.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A floating field-effect transistor circuit comprising:
    an FET device having source and drain terminals, and having symmetrical source and drain characteristics permitting interchanging the source and the drain terminals as a function of voltages between these terminals and a gate terminal;
    a balun having a first balanced terminal connected to the source terminal of said FET device and having a second balanced terminal connected to the drain terminal of said FET device, said balun having an unbalanced terminal serving to couple signals between said balun and a point external to said FET device; and
    circuit means for providing a balanced connection between said FET device and an external source of power.

2. A transistor circuit according to claim 1 wherein said FET device comprises a single FET.

3. A transistor circuit according to claim 1 wherein said FET device comprises two FET's connected in series to compensate for any asymmetry in current-voltage characteristics of said two FET's.

4. A transistor circuit according to claim 1 wherein said FET device comprises two FET's and means for interconnecting said two FET's to compensate for any asymmetry in current-voltage characteristics of said two FET's.

5. A transistor circuit according to claim 1 wherein said FET device comprises a field-effect transistor constructed of gallium arsenide with a metal-semiconductor interface.

6. A transistor circuit according to claim 1 wherein said balun comprises a transformer.

7. A transistor according to claim 1 wherein said circuit means further comprises means for impressing an alternating voltage between terminals of said FET device to alternate a source region and a drain region of said FET device.

8. A transistor circuit according to claim 1 wherein said circuit means includes inductors symmetrically connected between an external source of power and source and drain terminals of said FET device, there being a further inductor for coupling a bias signal to a gate terminal of said FET device; and wherein
    said circuit means further comprises means for combining an input signal with said bias signal at said gate terminal, an output signal of said transistor circuit appearing at said unbalanced terminal of said balun, and wherein said transistor circuit amplifies said input signal to provide said output signal.

9. A transistor circuit according to claim 8 comprising means for pulsing said bias signal, thereby to provide for a pulse modulation of said output signal.

10. A transistor circuit according to claim 8 wherein said power source is variable for applying a variable voltage between said source and said drain terminals of said FET device, a transistor of said FET device having a current gain dependent on the magnitude of the voltage between said source and said drain terminals, said transistor circuit being responsive to a variation in said power-source voltage to provide the functions of bipolar attenuation and modulation of said input signal.

11. A transistor circuit according to claim 10 wherein said source and said drain terminals are capacitively coupled by a symmetrical connection of capacitors to said balanced terminals of said balun.

12. A transistor circuit according to claim 1 wherein said connection of said pair of balanced terminals of said balun to said FET device is accomplished capacitively by symmetrically connected capacitors coupled respectively to the source terminal and the drain terminal of said FET device;

said circuit means is responsive to a first alternating input signal applied to said unbalanced terminal of said balun for impressing voltages between said source terminal and said drain terminal of said FET device to provide an incremental alternating current flow between said source terminal and said drain terminal; said circuit means including means for applying a second alternating input signal to a gate terminal of said FET device, said FET device having a current-voltage characteristic providing an output voltage between said source terminal and said drain terminal proportional to the product of said first input signal and said second input signal.

13. A transistor circuit according to claim 12 wherein the product of said first input signal and said second input signal is obtained by four-quadrant multiplication.

14. A transistor circuit according to claim 12 wherein said circuit means further comprises a first inductor and a second inductor symmetrically connected to said drain terminal and said source terminal, said first inductor and said second inductor providing for an integration of incremental current in said FET device to provide for a correlation of said first input signal and said second input signal.

15. A transistor circuit according to claim 14 wherein said correlation is a four-quadrant correlation.

16. A transistor circuit according to claim 1 wherein said connection between said FET device and said balanced terminals of said balun is a direct connection, said circuit means being responsive to an alternating source of power for impressing voltages between terminals of said FET device to alternate a source region and a drain region of a transistor of said FET device, said circuit means including means tuned to an alternating frequency of said power source for coupling power of said power source to said unbalanced terminal of said balun; and wherein said circuit means further comprises means for applying a bias signal to a gate terminal of said FET device, and tuning means tuned to a third harmonic of a signal of said power source for extracting power from said unbalanced terminal of said balun at a frequency which is three times greater than the alternating frequency of said power source.

17. A transistor circuit according to claim 1 wherein said circuit means includes first tuning means tuned to a first alternating current signal for applying power of said first alternating current signal to said unbalanced terminal of said balun, said balun coupling said power to drive said FET device at a frequency of said first alternating current signal;

said circuit means comprising means for coupling a second alternating current signal to a gate terminal of said FET device for driving said FET device at a frequency of said second alternating current signal, there being a second tuning means coupled to said unbalanced terminal of said balun for extracting an alternating current signal at a third frequency equal to an algebraic sum of the frequencies of said first and said second alternating current signals, said second tuning means being tuned to said third frequency, said third frequency being produced by interaction of said first and said second alternating current signals in said FET device for enabling said transistor circuit to function as a mixer.

18. A transistor circuit according to claim 17 wherein said connection between said balun and said FET device is a direct connection of said source terminal to one of said balanced terminals and a direct connection of said drain terminal to a second of said balanced terminals of said balun, thereby to permit said driving of said FET device by said first alternating current signal.

19. A floating transistor circuit comprising:
a transistor device having source and drain terminals, and having symmetrical source and drain characteristics permitting interchanging the source and the drain terminals as a function of voltages between these terminals and a gate terminal;
a balun having a first balanced terminal connected to the source terminal of said transistor device and having a second balanced terminal connected to the drain terminal of said transistor device, said balun having an unbalanced terminal serving to couple signals between said balun and a point external to said transistor device; and
circuit means for providing a balanced connection between said transistor device and an external source of power.

20. A transistor circuit according to claim 19 wherein said transistor device comprises a single transistor.

21. A transistor circuit according to claim 19 wherein said transistor device comprises two transistors connected in series to compensate for any asymmetry in current-voltage characteristics of said two transistors.

22. A transistor circuit according to claim 19 wherein said transistor device comprises two transistors and means for interconnecting said two transistors to compensate for any asymmetry in current-voltage characteristics of said two transistors.

23. A transistor circuit according to claim 19 wherein said balun comprises a transformer.

24. A transistor circuit according to claim 19 wherein said circuit means further comprises means for impressing an alternating voltage between terminals of said transistor device to alternate a source region and a drain region of said transistor device.

25. A transistor circuit according to claim 19 wherein said circuit means includes inductors symmetrically connected between an external source of power and source and drain terminals of said transistor device, there being a further inductor for coupling a bias signal to a gate terminal of said transistor device; and wherein
said circuit means further comprises means for combining an input signal with said bias signal at said gate terminal, an output signal of said transistor circuit appearing at said unbalanced terminal of said balun, and wherein said transistor circuit amplifies said input signal to provide said output signal.

26. A transistor circuit according to claim 25 comprising means for pulsing said bias signal, thereby to provide for a pulse modulation of said output signal.

27. A transistor circuit according to claim 25 wherein said power source is variable for applying a variable voltage between said source and said drain terminals of said transistor device, a transistor of said transistor device having a current gain dependent on the magnitude of the voltage between said source and said drain terminals, said transistor circuit being responsive to a variation in said power-source voltage to provide the functions of bipolar attenuation and modulation of said input signal.

28. A transistor circuit according to claim 27 wherein said source and said drain terminals are capacitively coupled by a symmetrical connection of capacitors to said balanced terminals of said balun.

29. A transistor circuit according to claim 19 wherein said connection of said pair of balanced terminals of said balun to said transistor device is accomplished capacitively by symmetrically connected capacitors coupled respectively to the source terminal and the drain terminal of said transistor device;

said circuit means is responsive to a first alternating input signal applied to said unbalanced terminal of said balun for impressing voltages between said source terminal and said drain terminal of said transistor device to provide an incremental alternating current flow between said source terminal and said drain terminal; said circuit means including means for applying a second alternating input signal to a gate terminal of said transistor device, said transistor device having a currentvoltage characteristic providing an output voltage between said source terminal and said drain terminal proportional to the product of said first input signal and said second input signal.

30. A transistor circuit according to claim 29 wherein the product of said first input signal and said second input signal is obtained by four-quadrant multiplication.

31. A transistor circuit according to claim 29 wherein said circuit means further comprises a first inductor and a second inductor symmetrically connected to said drain terminal and said source terminal, said first inductor and said second inductor providing for an integration of incremental current in said transistor device to provide for a correlation of said first input signal and said second input signal.

32. A transistor circuit according to claim 31 wherein said correlation is a four-quadrant correlation.

33. A transistor circuit according to claim 19 wherein said connection between said transistor device and said balanced terminals of said balun is a direct connection, said circuit means being responsive to an alternating source of power for impressing voltages between terminals of said transistor, device to alternate a source region and a drain region of a transistor of said transistor device, said circuit means including means tuned to an alternating frequency of said power source for coupling power of said power source to said unbalanced terminal of said balun; and wherein said circuit means further comprises means for applying a bias signal to a gate terminal of said transistor device, and tuning means tuned to a third harmonic of a signal of said power source for extracting power from said unbalanced terminal of said balun at a frequency which is three times greater than the alternating frequency of said power source.

34. A transistor circuit according to claim 19 wherein said circuit means includes first tuning means tuned to a first alternating current signal for applying power of said first alternating current signal to said unbalanced terminal of said balun, said balun coupling said power to drive said transistor device at a frequency of said first alternating current signal;

said circuit means comprising means for coupling a second alternating current signal to a gate terminal of said transistor device for driving said transistor device at a frequency of said second alternating current signal, there being a second tuning means coupled to said unbalanced terminal of said balun for extracting an alternating current signal at a third frequency equal to an algebraic sum of the frequencies of said first and said second alternating current signals, said second tuning means being tuned to said third frequency, said third frequency being produced by interaction of said first and said second alternating current signals in said transistor device for enabling said transistor circuit to function as a mixer.

35. A transistor circuit according to claim 34 wherein said connection said balun and said transistor device is a direct connection of said source terminal to one of said balanced terminals and a direct connection of said drain terminal to a second of said balanced terminals of said balun, thereby to permit said driving of said transistor device by said first alternating current signal.

36. The transistor circuit according to claim 4 wherein said means for interconnecting comprises a circuit connecting the source of each FET to the drain of the other FET.

37. The transistor circuit according to claim 22 wherein said means for interconnecting comprises a circuit connecting the source of each transistor to the drain of the other transistor.

* * * * *